(12) United States Patent
Uematsu et al.

(10) Patent No.: US 7,046,013 B2
(45) Date of Patent: May 16, 2006

(54) OPEN-CIRCUIT FAILURE DETECTION CIRCUIT

(75) Inventors: Katsuyuki Uematsu, Nagano (JP); Mutsuo Nishikawa, Nagano (JP); Katsumichi Ueyanagi, Nagano (JP)

(73) Assignee: Fuji Electric Co., Ltd., Kawasaki (JP)

( * ) Notice: Subject to any disclaimer, the term of this patent is extended or adjusted under 35 U.S.C. 154(b) by 437 days.

(21) Appl. No.: 10/401,772

(22) Filed: Mar. 31, 2003

(65) Prior Publication Data

US 2003/0197513 A1    Oct. 23, 2003

(30) Foreign Application Priority Data

Apr. 9, 2002  (JP) .............................. 2002-107186

(51) Int. Cl.
*G01R 31/08*    (2006.01)

(52) U.S. Cl. ...................................... 324/525; 324/522
(58) Field of Classification Search ................ 324/525, 324/526, 503, 522; 340/510
See application file for complete search history.

(56) References Cited

U.S. PATENT DOCUMENTS

| 3,553,687 A | * | 1/1971 | Reiss ........................... 340/510 |
| 3,936,821 A | * | 2/1976 | Cooper et al. .............. 340/510 |
| 4,399,402 A | * | 8/1983 | Pelletier ..................... 324/525 |
| 5,086,293 A | * | 2/1992 | Takahashi et al. .......... 340/506 |
| 5,347,225 A | * | 9/1994 | Graham ..................... 324/523 |

FOREIGN PATENT DOCUMENTS

| JP | 61-180121 | 8/1986 |
| JP | 62-251677 | 11/1987 |

* cited by examiner

*Primary Examiner*—Anjan Deb
(74) *Attorney, Agent, or Firm*—Manabu Kanesaka

(57) ABSTRACT

A broken-wire-failure detection circuit connected to a higher circuit includes a power line, a signal line, a ground line, and at least one of the first resistance device connected between the power line and the signal line and the second resistance device connected between the signal line and the ground line. The broken-wire-failure detection circuit also includes the third resistance device connected between the power line and the ground line, and a signal output circuit connected to the second power line, the second signal line and the second ground line.

18 Claims, 9 Drawing Sheets

OPEN-CIRCUIT FAILURE DETECTION CIRCUIT

BACKGROUND OF THE INVENTION AND RELATED ART STATEMENT

The present invention relates to a broken-wire failure detection circuit with a failure detection function for outputting a voltage out of a normal output-voltage range as a dialog voltage when a broken-wire failure occurs in a power line, signal line, or ground line of an electric or electronic circuit connected to a higher circuit.

Figure 16:
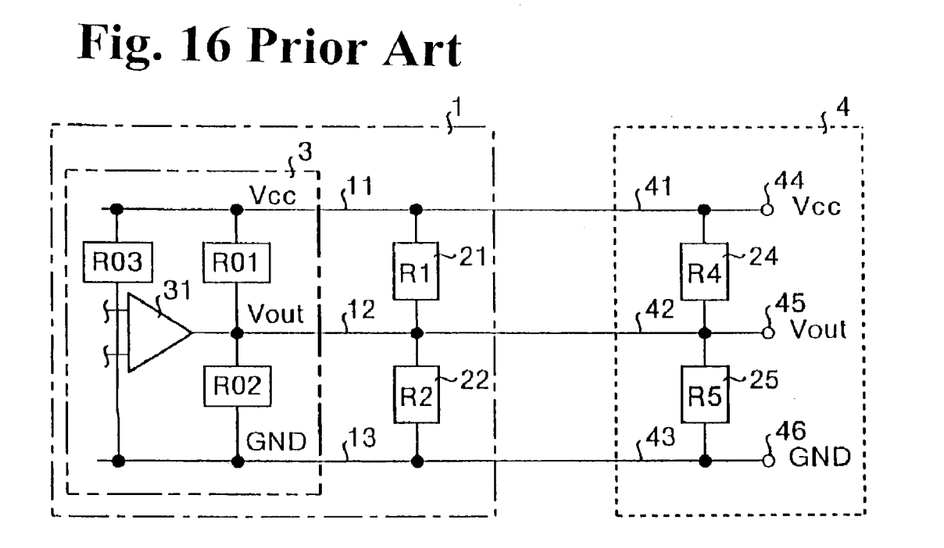
FIG. 16 is a circuit diagram showing a configuration of a conventional broken-wire detection circuit.

FIG. 16 is a circuit diagram showing a configuration of a conventional broken-wire failure detection circuit. As shown in FIG. 16, the conventional broken-wire failure detection circuit includes a functional circuit 1 composed of an electric or electronic circuit in which the first resistance means 21 is connected between a power line 11 and a signal line 12, and the second resistance means 22 is connected between the signal line 12 and a ground line 13.

The power line 11 of the functional circuit 1 is connected to a power line 41 of a higher circuit 4 that supplies power to the functional circuit 1. The signal line 12 of the functional circuit 1 is connected to a signal output terminal 45 via a signal line 42 of the higher circuit 4. A signal output-circuit section 3 is provided in the functional circuit 1. A signal from a signal output-circuit output stage amplifier 31 in the signal output-circuit section 3 is output from a signal output terminal 45 via the signal lines 12 and 42. The ground line 13 of the functional circuit 1 is connected to a ground line 43 of the higher circuit 4.

In the higher circuit 4, an internal resistance between the power line 41 and the signal line 42 constitutes the fourth resistance means 24. Further, an internal resistance between the signal line 42 and the ground line 43 constitutes the fifth resistance means 25. The power line 41 and ground line 43 of the higher, circuit 4 are connected to a power terminal 44 and a ground terminal 46.

Figure 17:
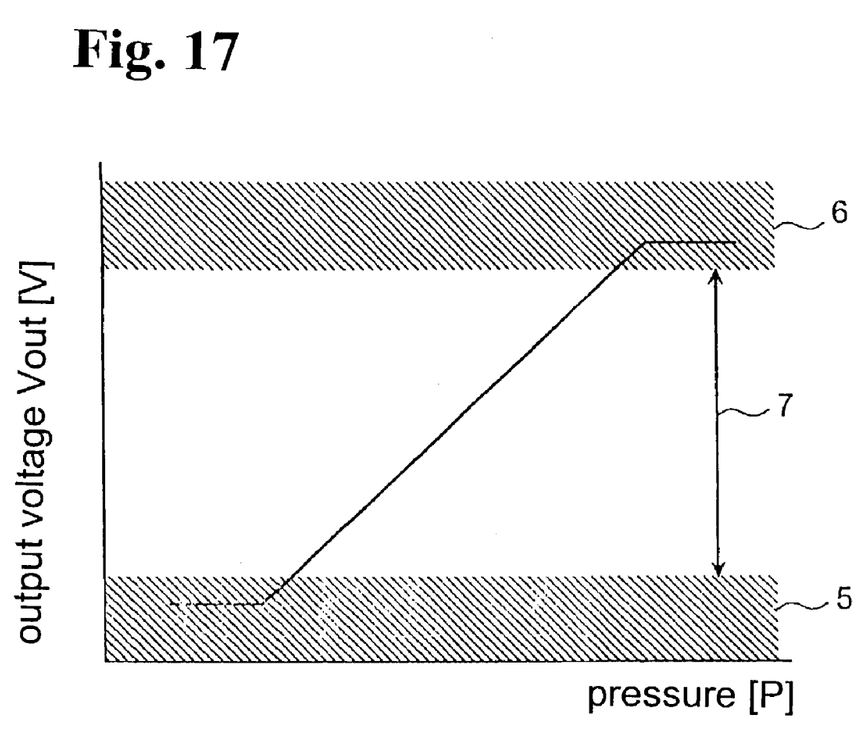
FIG. 17 is a graph illustrating a range of an output voltage from a semiconductor pressure sensor.

When the broken-wire failure detection circuit configured as shown in FIG. 16 is applied to, for example, a semiconductor pressure sensor of a vehicle, a power voltage Vcc of 5 V is supplied to a sensor constituting the functional circuit 1. FIG. 17 schematically shows the output-voltage characteristics of the semiconductor pressure sensor. As shown in FIG. 17, if there is no broken-wire failure, the output voltage Vout from the sensor varies within a normal output-voltage range 7 between, for example, 0.5 V and 4.5 V, depending on the applied voltage.

If a broken-wire failure occurs in the power line, signal line, or ground line of an interface section connected to an ECU (Electronic Control Unit) constituting the higher circuit 4, the sensor output voltage Vout shifts to a voltage range 5 (hereinafter referred to as the "lower dialog-voltage range") lower than the normal output-voltage range 7, or a voltage range 6 (hereinafter referred to as the "upper dialog-voltage range") higher than the normal output-voltage range 7.

For the convenience of the description, the resistance values of the first, second, fourth, and fifth resistance means 21, 22, 24, and 25 are defined as R1, R2, R4, and R5, respectively. A composite resistance value obtained by adding internal resistance values R01, R02, and R03, or a composite resistance value when resistance means with resistance values Ra and Rb, respectively, are connected together in parallel, is defined as Ra//Rb. A composite resistance value is defined as Ra//Rb//Rc when resistance means with resistance values Ra, Rb, and Rc are connected together in parallel.

When a connection between the power line 11 of the functional circuit 1 and the power line 41 of the higher circuit 4 is broken, the output voltage Vout is determined from a partial voltage ratio of the resistance value R4 of the fourth resistance means 24 to the composite resistance value of the parallel connection between the second resistance means 22 and the fifth resistance means 25 (R2//R5). Accordingly, the voltage Vout is expressed by Equation (1) shown below.

$$V\text{out}=\{R2//R02//R5//(R1//R01+R03)\}/\{R2//R02//R5//(R1//R01+R03)+R4\}\times Vcc \qquad (1)$$

In this case, a value of the voltage Vout is within the lower dialog-voltage range 5 and thus smaller than 0.5 V. Accordingly, the second resistance means 22, constituting a broken-wire failure detection circuit, has its resistance value R2 selected so as to satisfy Equation (2) shown below.

$$\{R2//R02//R5//(R1//R01+R03)\}/\{R2//R02//R5//(R1//R01+R03)+R4\}\times Vcc<0.5 \qquad (2)$$

On the other hand, when a connection between the ground line 13 of the functional circuit 1 and the ground line 43 of the higher circuit 4 is broken, the output voltage Vout is determined from a partial voltage ratio of the resistance value R5 of the fifth resistance means 25 to the composite resistance value (R1//R4) of the parallel connection between the first resistance means 21 and the fourth resistance means 24. Accordingly, the voltage Vout is expressed by Equation (3) shown below.

$$V\text{out}=R5/\{R1//R01//R4//(R2//R02+R03)+R5\}\times Vcc \qquad (3)$$

In this case, a value of the voltage Vout is within the upper dialog-voltage range 6 and thus higher than 4.5 V. Accordingly, the first resistance means 21, constituting a broken-wire failure detection circuit, has its resistance value R1 selected so as to satisfy Equation (4) shown below.

$$R5/\{(R1//R01//R4)//(R2//R02+R03)+R5\}\times Vcc>4.5 \qquad (4)$$

Recently, as an electronic control in automobiles has advanced, the normal output-voltage range 7 of the sensor has expanded to, for example, between 0.3 V and 4.8 V. Correspondingly, the lower dialog-voltage range 5 must be below the value of 0.3 V. To this end, the current resistance value R2 of the second resistance means 22 must be reduced. Likewise, the upper dialog-voltage range 6 must be above 4.8 V. Thus, the current resistance value R1 of the first resistance means 21 must be reduced.

When the resistance value R2 of the second resistance means 22 is reduced, it is necessary to increase a source current to the signal output-circuit output stage 31 of the functional circuit 1 during a normal operation. A transistor size or the like must be increased, thereby increasing a scale of the circuit. The scale of the circuit is also increased when the resistance value R1 of the first resistance means 21 is reduced. It is necessary to increase a sink current from the signal output-circuit output-stage amplifier 31 of the functional circuit 1 during a normal operation as well. Therefore, a transistor size or the like must be increased, thereby increasing the scale of the circuit.

The present invention is provided in view of these problems. It is an object of the present invention to provide a broken-wire failure detection circuit that can reduce the upper-limit value of the lower dialog-voltage range, and increase the lower-limit value of the upper dialog-voltage range without restrictions on a load-driving ability of the sink or source current in the signal output circuit.

Further objects and advantages of the invention will be apparent from the following description of the invention.

SUMMARY OF THE INVENTION

To accomplish the objects, the present invention provides a broken-wire failure detection circuit as a functional circuit connected to a higher circuit, in which resistance means is connected between a power line and a signal line and/or between the signal line and a ground line. The broken-wire failure detection circuit includes first resistance means connected between a power line at a functional circuit side and a signal line at the functional circuit side and/or second resistance means connected between the signal line at the functional circuit side and a ground line at the functional circuit side, and third resistance means connected between the power line at the functional circuit side and the ground line at the functional circuit side.

According to the present invention, due to the third resistance means, a value of an apparent pull down resistance decreases when a connection between the power line at the functional circuit side and the power line of the higher circuit is broken. A value of an apparent pull up resistance decreases when a connection between the ground line at the functional circuit side and the ground line of the higher circuit is broken. Further, the third resistance means is independent of a load-driving ability of a signal output circuit in the functional circuit. Therefore, the third resistance means does not affect a voltage value of an output signal when there is no broken wire.

DETAILED DESCRIPTION OF PREFERRED EMBODIMENTS

Hereunder, embodiments of the present invention will be described in detail with reference to the accompanying drawings.

Figure 1:
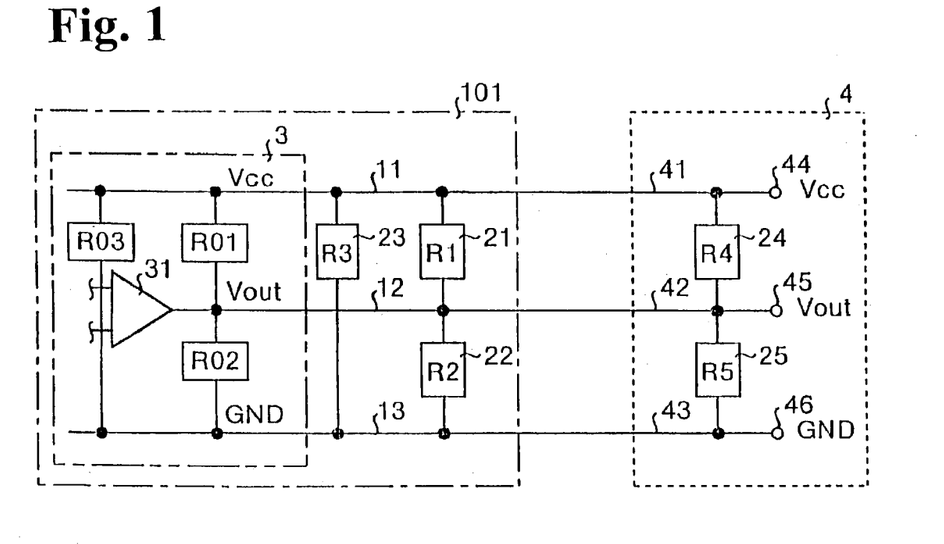
FIG. 1 is a circuit diagram showing a configuration of a broken-wire failure detection circuit according to the first embodiment of the present invention.

FIG. 1 is a circuit diagram showing a configuration of a broken-wire failure detection circuit according to the first embodiment of the present invention. As shown in FIG. 1, the broken-wire failure detection circuit according to the first embodiment comprises the third resistance means 23 connected between a functional-circuit-side power line 11 and a functional-circuit-side ground line 13 of a conventional broken-wire failure detection circuit shown in FIG. 16. That is, in a functional circuit 101, the first resistance means 21 is connected between the power line 11 and a signal line 12. The second resistance means 22 is connected between the signal line 12 and the ground line 13. Furthermore, the third resistance means 23 is connected between the power line 11 and the ground line 13. Other arrangements of the functional circuit 101 and a configuration of the higher circuit 4 are the same as those shown in FIG. 16. Thus, they are denoted by the same reference numerals used in FIG. 16, and their descriptions are omitted.

Figure 2:
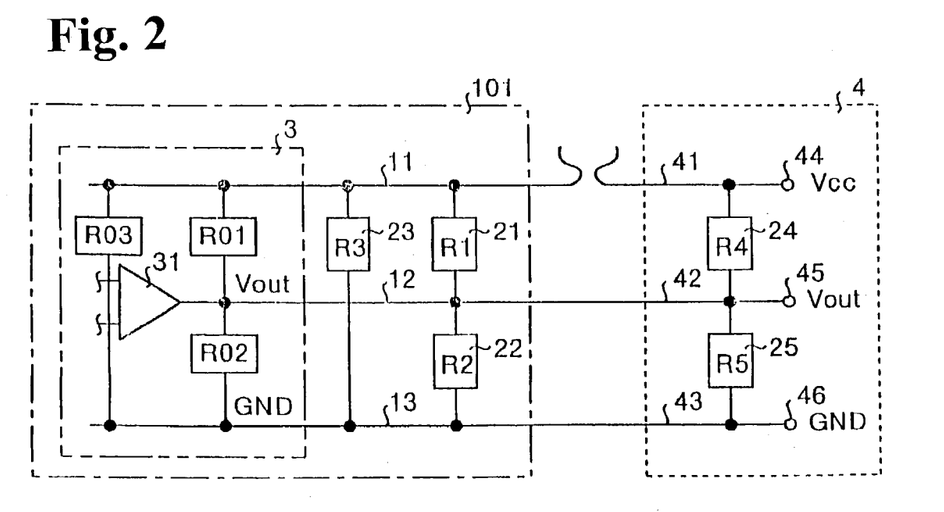
FIG. 2 is a circuit diagram showing a broken power line in the broken-wire failure detection circuit according to the first embodiment of the present invention.

In the configuration shown in FIG. 1, if a connection between the power line 11 of the functional circuit 101 and the power line 41 of the higher circuit 4 is broken as shown in FIG. 2, the second resistance means 22, the fifth resistance means 25 of the higher circuit 4, and the first and third resistance means 21 and 23, all of which constitute a series-connected unit, are connected in parallel. At this time, an apparent pull-down-resistance value, which is indicated by a composite resistance value (R2//R02//R5//(R1//R01+R3//R03)) obtained by adding an internal resistance values R01, R02, and R03, becomes below a pull-down-resistance value obtained when a connection between the power lines 11 and 41 is broken in the conventional configuration shown in FIG. 16. In this case, R3 denotes a resistance value of the third resistance means 23.

Accordingly, Equation (5) shown below defines an output voltage Vout determined from a partial voltage ratio of the apparent pull-down-resistance value (R2//R02//R5//(R1//R01+R3//R03)) to the resistance value R4 of the fourth resistance means 24 of the higher circuit 4. That is, in this case, the output voltage Vout decreases as compared to the conventional configuration shown in FIG. 16.

$$Vout=\{R2//R02//R5//(R1//R01+R3//R03)\}/\{R2//R02//R5(R1//R01+R3//R03)+R4\}\times Vcc \quad (5)$$

In this case, the third resistance means 23 is independent of a load-driving ability (source current) of a signal output-circuit output-stage amplifier 31. Consequently, the third resistance means does not affect a voltage value of an output signal if there is no broken wire or connection. Thus, it is not necessary to increase the load-driving ability (source current) of the signal output-circuit output-stage amplifier 31, thereby reducing a scale of the circuit.

Figure 3:
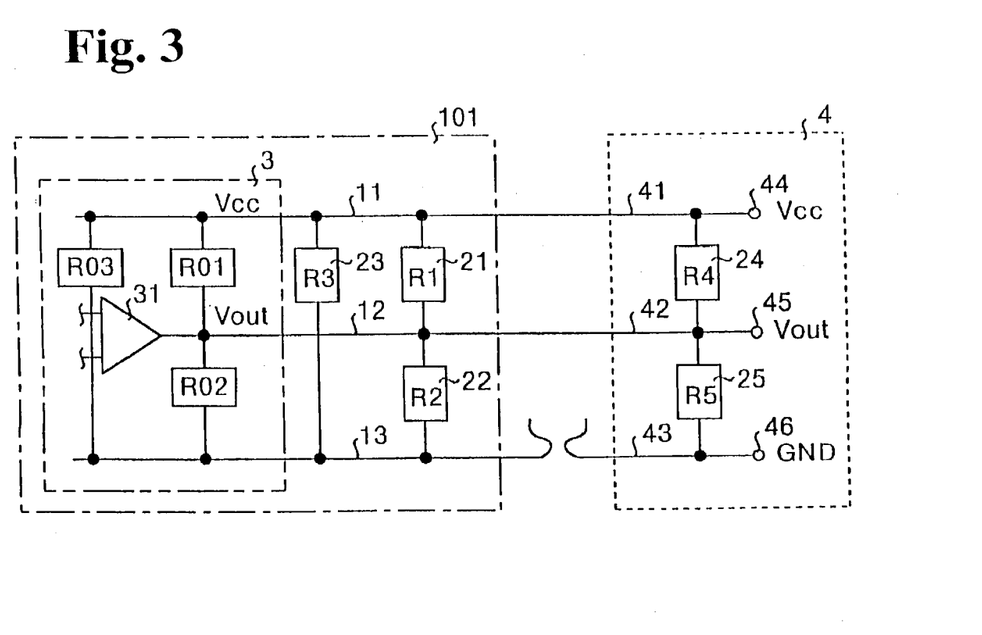
FIG. 3 is a circuit diagram showing a broken ground line in the broken-wire failure detection circuit according to the first embodiment of the present invention.

Further, in the configuration shown in FIG. 1, if a connection between the ground line 13 of the functional circuit 101 and the ground line 43 of the higher circuit 4 is broken as shown in FIG. 3, the first resistance means 21, the fourth resistance means 24 of the higher circuit 4, and the second and third resistance means 22 and 23, all of which constitute a series-connected unit, are connected in parallel. At this time, the apparent pull-up-resistance value, which is indicated by the composite resistance value (R1//R01//R4//(R2//R02+R3//R03)) obtained by combining the internal resistance values R01, R02, and R03, becomes below the pull-up-resistance value obtained when a connection between the ground lines 13 and 43 is broken in the conventional configuration shown in FIG. 16.

Accordingly, Equation (6) shown below defines the output voltage Vout determined from the partial voltage ratio of the apparent pull-up-resistance value (R1//R01//R4//(R2//R02+R3//R03)) to the resistance value R5 of the fifth resistance means 25 of the higher circuit 4. That is, in this case, the output voltage Vout increases as compared to the conventional configuration shown in FIG. 16.

$$Vout=R5/\{R1//R01//R4//(R2//R02+R3//R03)+R5\}\times Vcc \quad (6)$$

Also, in this case, the third resistance means 23 is independent of the load-driving ability (sink current) of the signal output-circuit output-stage amplifier 31. Consequently, the third resistance means does not affect the voltage value of an output signal if no wires are broken. This eliminates the need to increase the load-driving ability (sink current) of the signal output-circuit output-stage amplifier 31, thus suppressing an increase in the scale of the circuit.

In this case, the value of the output voltage Vout expressed by Equation (5), described previously, is within a lower dialog-voltage range 5 shown in FIG. 17. On the other hand, the value of the output voltage Vout expressed by Equation (6), described previously, is within an upper dialog-voltage range 6 shown in FIG. 17. Consequently, in the configuration shown in FIG. 1, the resistance values R1, R2, and R3 of the first, second, and third resistance means 21, 22, and 23, respectively, are selected so as to satisfy both Equations (7) and (8) shown below.

$$\{R2//R02//R5//(R1//R01+R3//R03)\}/\{R2//R02//R5(R1//R01+R3//R03)+R4\}\times Vcc \leq \text{an upper-limit value of the lower dialog-voltage range 5} \quad (7)$$

$$R5/\{R1//R01//R4//(R2//R02+R3//R03)+R5\}\times Vcc \geq \text{a lower-limit value of the upper dialog-voltage range 6} \quad (8)$$

For example, when the normal output-voltage rang 7 of the sensor is between 0.3 V and 4.8 V, then both Equations (9) and (10) shown below must be satisfied.

$$\{R2//R02//R5//(R1//R01+R3//R03)\}/\{R2//R02//R5(R1//R01+R3//R03)+R4\}\times Vcc<0.3 \quad (9)$$

$$R5/\{R1//R01//R4//(R2//R02+R3//R03)+R5\}\times Vcc>4.8 \quad (10)$$

Figure 4:
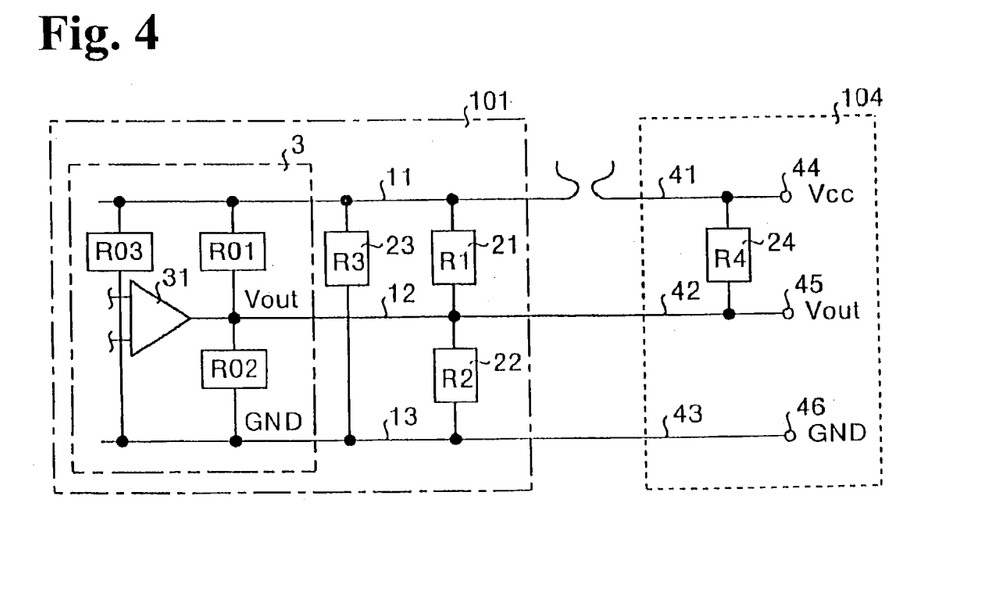
FIG. 4 is a circuit diagram showing another example in which the power line is broken in the broken-wire failure detection circuit according to the first embodiment of the present invention.

As shown in FIG. 4, when the higher circuit 104 connected to the functional circuit 101 has only the fourth resistance means 24, and the connection between the power line 11 of the functional circuit 101 and the power line 41 of the higher circuit 104 is broken, the second resistance means 22, the first resistance means 21, and the third resistance means 23, all of which constitute a series-connected unit, are connected in parallel. At this time, the apparent pull-down-resistance value, which is indicated by the composite resistance value (R2//R02//(R1//R01+R3//R03)) obtained by combining the internal resistance values R01, R02, and R03, becomes the following pull-down-resistance value obtained if the pull-down resistance is provided only through the second resistance means 22.

Accordingly, Equation (11) shown below defines the output voltage Vout determined from the partial voltage ratio of the apparent pull-up-resistance value (R2//R02//(R1//R01+R3//R03)) to the resistance value R4 of the fourth resistance means 24 of the higher circuit 104. That is, in this case, the output voltage Vout decreases as compared to the situation when the third resistance means 23 is absent.

$$Vout=\{R2//R02//(R1//R01+R3//R03)\}/\{R2//R02//(R1//R01+R3//R03)+R4\}\times Vcc \quad (11)$$

Also in this case, the third resistance means 23 is independent of the load-driving ability (source current) of the signal output-circuit output-stage amplifier 31. Consequently, the third resistance means does not affect the voltage value of an output signal if no wires are broken. This eliminates the need to increase the load-driving ability (source current) of the signal output-circuit output-stage amplifier 31, thus suppressing an increase in the scale of the circuit.

In this case, the value of the output voltage Vout defined by Equation (11), described previously, is within the lower dialog-voltage range 5 in FIG. 17. Consequently, in the configuration shown in FIG. 4, the resistance values R1, R2, and R3 of the first, second, and third resistance means 21, 22, and 23, respectively, are selected so as to satisfy Equation (12) shown below. For example, if the normal output-voltage range 7 of the sensor is between 0.3 V and 4.8 V, then Equation (13) shown below must be satisfied.

$$Vout=\{R2//R02//(R1//R01+R3//R03)\}/\{R2//R02//(R1//R01+R3//R03)+R4\}\times Vcc \leq \text{the upper-limit value of the lower dialog-voltage range 5} \quad (12)$$

$$Vout=\{R2//R02//(R1//R01+R3//R03)\}/\{R2//R02//(R1//R01+R3//R03)+R4\}\times Vcc<0.3 \quad (13)$$

Figure 5:
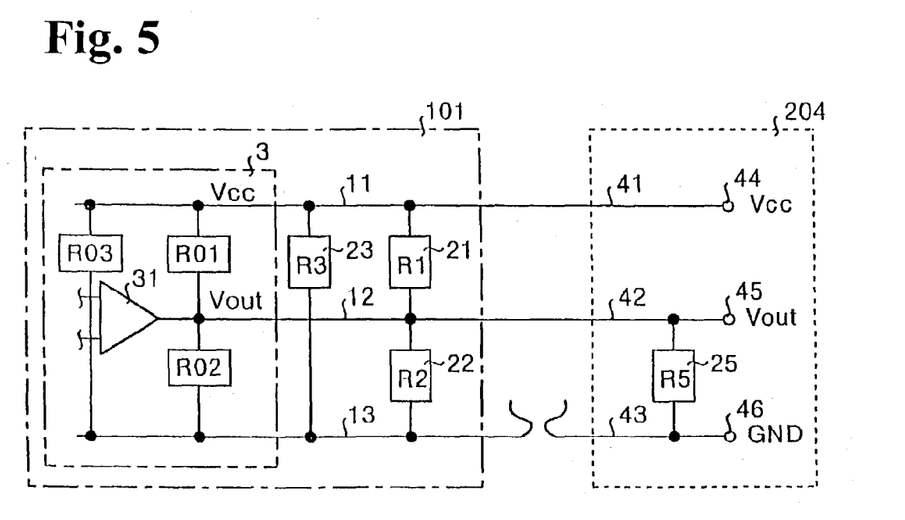
FIG. 5 is a circuit diagram showing another example in which the ground line is broken in the broken-wire failure detection circuit according to the first embodiment of the present invention.

Further, as shown in FIG. 5, when a higher circuit 204 connected to the functional circuit 101 has only the fifth resistance means 25, and the connection between the ground line 13 of the functional circuit 101 and the ground line 43 of the higher circuit 204 is broken, the first resistance means 21, the second resistance means 22, and the third resistance means 23, all of which constitute a series-connected unit, are connected in parallel. At this time, the apparent pull-up-resistance value, which is indicated by the composite resistance value (R1//R01//(R2//R02+R3//R03)) obtained by combining the internal resistance values R01, R02, and R03, becomes below the pull-up-resistance value obtained if the pull-up resistance is provided only through the first resistance means 21.

Accordingly, Equation (14) shown below defines the output voltage Vout determined from the partial voltage ratio of the apparent pull-up-resistance value (R1//R01//(R2//R02+R3//R03)) to the resistance value R5 of the fifth resistance means 25 of the higher circuit 204. That is, in this case, the output voltage Vout decreases as compared to a situation when the third resistance means 23 is absent.

$$Vout = R5/\{R1//R01//(R2//R02+R3//R03)+R5\} \times Vcc \quad (14)$$

Also, in this case, the third resistance means 23 is independent of the load-driving ability (sink current) of the signal output-circuit output-stage amplifier 31. Consequently, the third resistance means does not affect the voltage value of an output signal if no wires are broken. This eliminates the need to increase the load-driving ability (sink current) of the signal output-circuit output-stage amplifier 31, thus suppressing an increase in the scale of the circuit.

In this case, the value of the output voltage Vout defined by Equation (14), described previously, is within the upper dialog-voltage range 6 in FIG. 17. Consequently, in the configuration shown in FIG. 5, the resistance values R1, R2, and R3 of the first, second, and third resistance means 21, 22, and 23, respectively, are selected so as to satisfy Equation (15) shown below. For example, when the normal output-voltage range 7 of the sensor is between 0.3 V and 4.8 V, Equation (16) shown below must be satisfied.

$$R5/\{R1//R01//(R2//R02+R3//R03)+R5\} \times Vcc \geq \text{the lower-limit value of the upper dialog-voltage range 6} \quad (15)$$

$$R5/\{R1//R01//(R2//R02+R3//R03)+R5\} \times Vcc > 4.8 \quad (16)$$

According to the first embodiment, described above, the third resistance means 23 serves to reduce the apparent pull-down-resistance value when the connection between the functional-circuit-side power line 11 and the power line 41 of the higher circuits 4, 104 is broken. On the other hand, the apparent pull-up-resistance value decreases when the connection between the functional-circuit-side ground line 13 and the ground line 43 of the higher circuits 4, 204 is broken. In this case, it is unnecessary to increase the load-driving ability of the signal output-circuit output-stage amplifier 31 in the functional circuit 101. Accordingly, the upper-limit value of the lower dialog-voltage range 5 can be reduced and the lower-limit value of the upper dialog-voltage range 6 can be increased, while avoiding an increase in the scale of the circuit.

Figure 6:
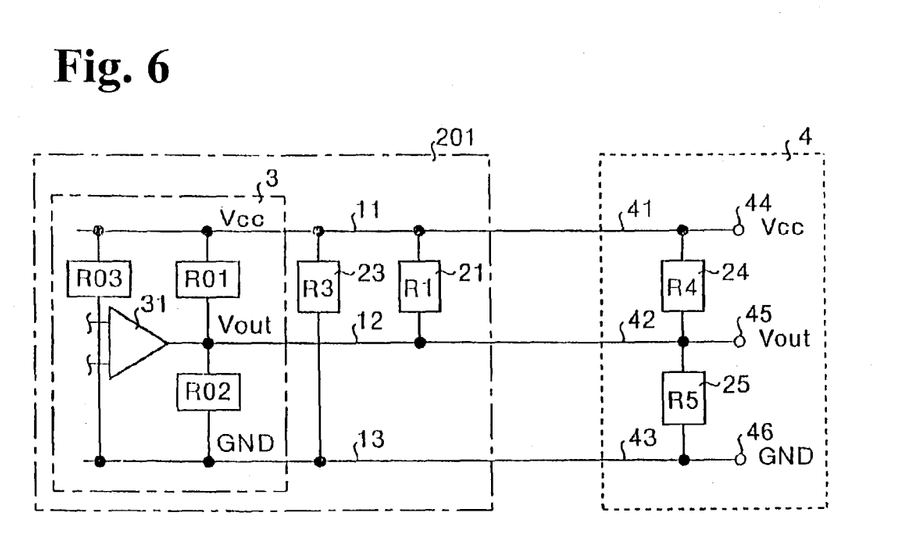
FIG. 6 is a circuit diagram showing a configuration of a broken-wire failure detection circuit according to the second embodiment of the present invention.

FIG. 6 is a circuit diagram showing a configuration of a broken-wire failure detection circuit according to the second embodiment of the present invention. As shown in FIG. 6, the broken-wire failure detection circuit according to the second embodiment corresponds to the conventional broken-wire failure detection circuit shown in FIG. 16, wherein the third resistance means 23 is connected between the functional-circuit-side power line 11 and the functional-circuit-side ground line 13, and the second resistance means 22 (see FIG. 16) is removed. That is, in a functional circuit 201, the first resistance means 21 is connected between the power line 11 and the signal line 12. Further, the third resistance means 23 is connected between the power line 11 and the ground line 13. Other arrangements of the functional circuit 201 and the configuration of the higher circuit 4 are the same as those shown in FIG. 16. Thus, they are denoted by the same reference numerals as in FIG. 16, and their descriptions are omitted.

Figure 7:
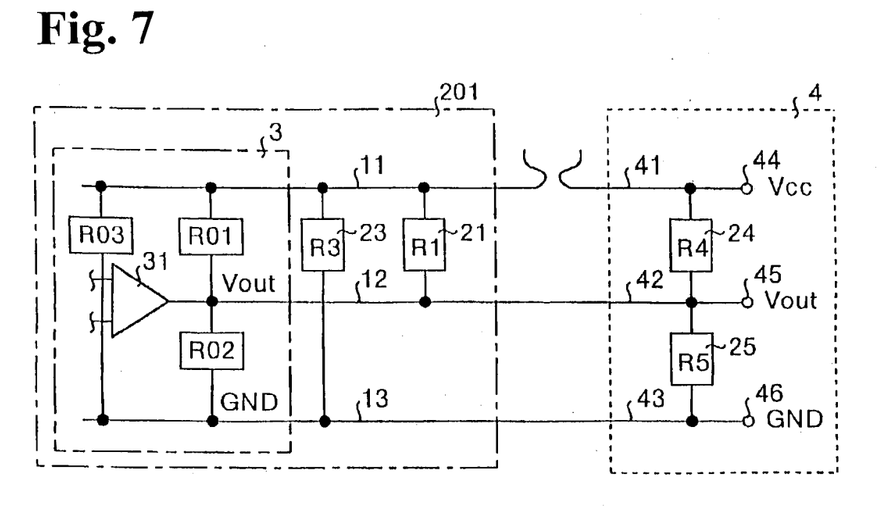
FIG. 7 is a circuit diagram showing a broken power line in the broken-wire failure detection circuit according to the second embodiment of the present invention.

In the configuration shown in FIG. 6, when a connection between the power line 11 of the functional circuit 201 and the power line 41 of the higher circuit 4 is broken as shown in FIG. 7, the fifth resistance means 25 of the higher circuit 4 and the first and third resistance means 21 and 23, all of which constitute a series-connected unit, are connected in parallel. At this time, the apparent pull-down-resistance value corresponds to the composite resistance value (R5//R02//(R1//R01+R3//R03)) obtained by adding the internal resistance values R01, R02, and R03.

Accordingly, Equation (17) shown below defines the output voltage Vout determined from the partial voltage ratio of the apparent pull-down-resistance value (R5//R02//(R1//R01+R3//R03)) to the resistance value R4 of the fourth resistance means 24 of the higher circuit 4. That is, in this case, the output voltage Vout decreases as compared to a situation when the third resistance means 23 is absent.

$$Vout = \{R5//R02//(R1//R01+R3//R03)\}/\{R5//R02//(R1//R01+R3//R03)+R4\} \times Vcc \quad (17)$$

In this case, the third resistance means 23 is independent of the load-driving ability (source current) of the signal output-circuit output-stage amplifier 31. Consequently, the third resistance means does not affect the voltage value of an output signal if no wires are broken. This eliminates the need to increase the load-driving ability (source current) of the signal output-circuit output-stage amplifier 31, thus suppressing an increase in the scale of the circuit.

Figure 8:
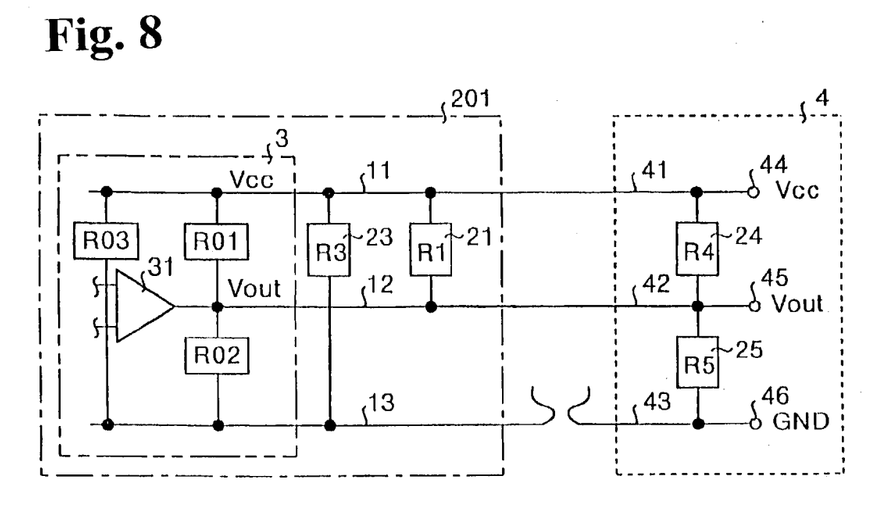
FIG. 8 is a circuit diagram showing a broken ground line in the broken-wire failure detection circuit according to the second embodiment of the present invention.

Further, in the configuration shown in FIG. 6, when a connection between the ground line 13 of the functional circuit 201 and the ground line 43 of the higher circuit 4 is broken as shown in FIG. 8, the first resistance means 21 and the fourth resistance means 24 of the higher circuit 4 are connected in parallel. At this time, the apparent pull-up-resistance value corresponds to the composite resistance value (R1//R01//R4//(R3//R03+R02)).

Accordingly, Equation (18) shown below defines the output voltage Vout determined from the partial voltage ratio of the apparent pull-up-resistance value (R1//R01//R4//(R3//R03+R02)) to the resistance value R5 of the fifth resistance means 25 of the higher circuit 4.

$$Vout = R5/\{R1//R01//R4//(R3//R03+R02)+R5\} \times Vcc \quad (18)$$

In this case, the value of the output voltage Vout defined by Equation (17), described previously, is within the lower dialog-voltage range 5 in FIG. 17. On the other hand, the value of the output voltage Vout defines by Equation (18), described previously, is within the upper dialog-voltage range 6 in FIG. 17. Consequently, in the configuration shown in FIG. 6, the resistance values R1 and R3 of the first and third resistance means 21 and 23, respectively, are selected so as to satisfy both Equations (19) and (20) shown below.

$$\{R5//R02//(R1//R01+R3//R03)\}/\{R5//R02//(R1//R01+R3//R03)+R4\} \times Vcc \leq \text{the upper-limit value of the lower dialog-voltage range 5} \quad (19)$$

$$R5/\{R1//R01//R4//(R3//R03+R02)+R5\} \times Vcc \geq \text{the lower-limit value of the upper dialog-voltage range 6} \quad (20)$$

For example, when the normal output-voltage range 7 of the sensor is between 0.3 V and 4.8 V, then both Equations (21) and (22) shown below must be satisfied.

$$\{R5//R02//(R1//R01+R3//R03)\}/\{R5//R02//(R1//R01+R3//R03)+R4\} \times Vcc < 0.3 \quad (21)$$

$$R5/\{R1//R01//R4//(R3//R03+R02)+R5\} \times Vcc > 4.8 \quad (22)$$

Figure 9:
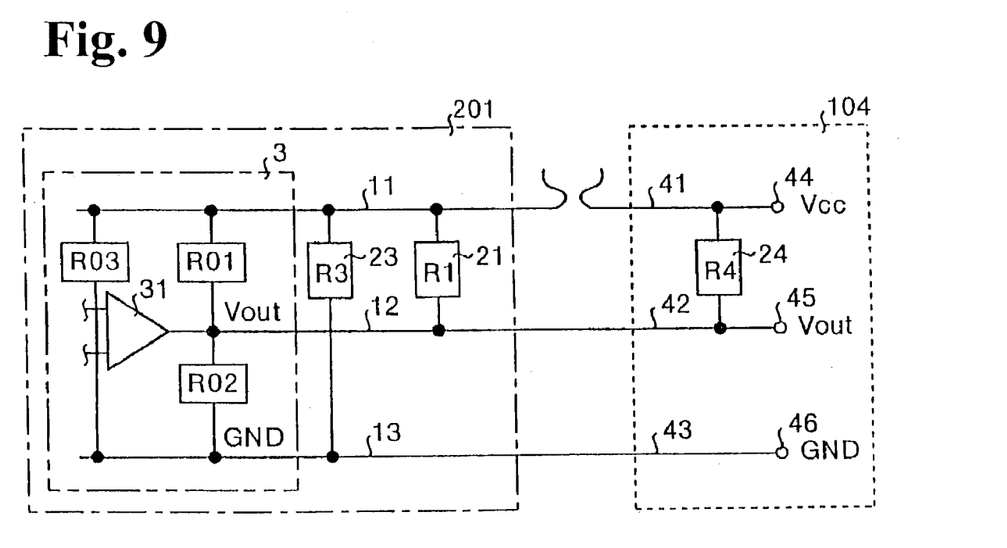
FIG. 9 is a circuit diagram showing another example in which the power line is broken in the broken-wire failure detection circuit according to the second embodiment of the present invention.

As shown in FIG. 9, when the functional circuit 201 is connected to the higher circuit 104 having only the fourth resistance means 24, and the connection between the power line 11 of the functional circuit 201 and the power line 41 of the higher circuit 104 is broken, the first resistance means 21 and the third resistance means 23 are connected in series. At this time, the pull-down-resistance value corresponds to the composite resistance value $((R1//R01+R3//R03)//R02)$ obtained by combining the internal resistance values R01, R02, and R03.

Accordingly, Equation (23) shown below defines the output voltage Vout determined from the partial voltage ratio of the pull-down-resistance value $((R1//R01+R3//R3)//R02)$ to the resistance value R4 of the fourth resistance means 24 of the higher circuit 104.

$$V\text{out} =\{(R1//R01+R3//R03)//R03)\}/\{(R1//R01+R3//R03)//R02+R4\}\times Vcc \quad (23)$$

Also in this case, the third resistance means 23 is independent of the load-driving ability (source current) of the signal output-circuit output-stage amplifier 31. Consequently, the third resistance means does not affect the voltage value of an output signal if no wires are broken. This eliminates the need to increase the load-driving ability (source current) of the signal output-circuit output-stage amplifier 31, thus suppressing an increase in the scale of the circuit.

In this case, the value of the output voltage Vout defined by Equation (23), described previously, is within the lower dialog-voltage range 5 in FIG. 17. Consequently, in the configuration shown in FIG. 9, the resistance values R1 and R3 of the first and third resistance means 21 and 23, respectively, are selected so as to satisfy Equation (24) shown below. For example, when the normal output-voltage range 7 of the sensor is between 0.3 V and 4.8 V, Equation (25) shown below must be satisfied.

$$\{(R1//R01+R3//R03)//R02\}\}/\{R1//R01+R3//R03)//R02+R4\}\times Vcc \leq \text{the upper-limit value of the lower dialog-voltage range 5} \quad (24)$$

$$\{(R1//R01+R3//R03)//R02\}/\{(R1//R01+R3//R03)//R02+R4\}\times Vcc<0.3 \quad (25)$$

Figure 10:
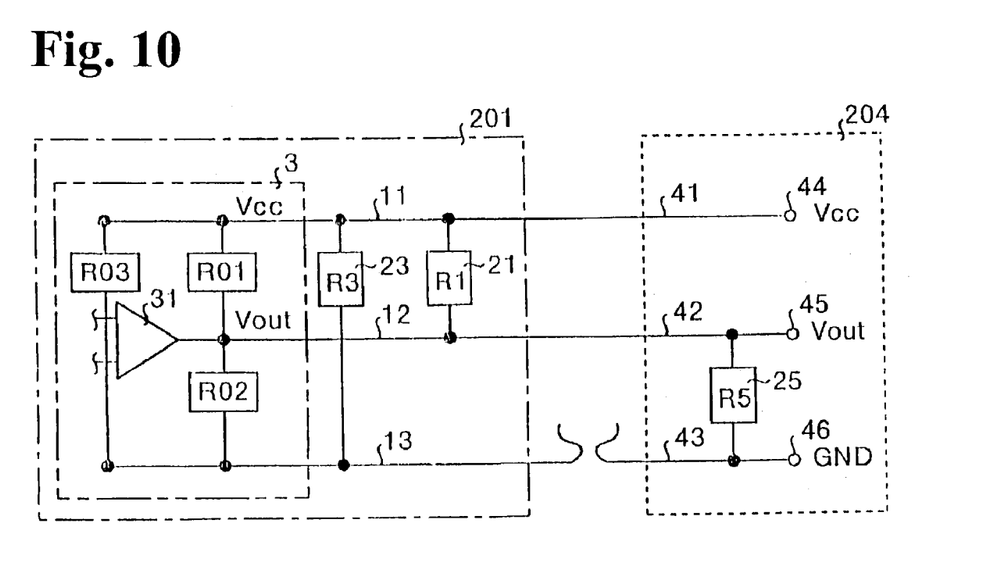
FIG. 10 is a circuit diagram showing another example in which the ground line is broken in the broken-wire failure detection circuit according to the second embodiment of the present invention.

Further, as shown in FIG. 10, when the functional circuit 201 is connected to the higher circuit 204 having only the fifth resistance means 25 and the connection between the ground line 13 of the functional circuit 201 and the ground line 43 of the higher circuit 204 is broken, the first resistance means 21 constitutes the pull-up resistance. The pull-up-resistance value $(R1//R01//(R3//R03+R02))$ is obtained by combining the internal resistance values R01, R02, and R03.

Accordingly, Equation (26) shown below defines the output voltage Vout determined from the partial voltage ratio of the apparent pull-up-resistance value $(R1//R01//(R3//R03+R02))$ to the resistance value R5 of the fifth resistance means 25 of the higher circuit 204.

$$V\text{out}=R5/\{R1//R01//(R3//R03+R02)+R5\}\times Vcc \quad (26)$$

In this case, the value of the output voltage Vout expressed by Equation (26), described previously, is within the upper dialog-voltage range 6 in FIG. 17. Consequently, in the configuration shown in FIG. 10, the resistance value R1 of the first resistance means 21 is selected so as to satisfy Equation (27) shown below. For example, when the normal output-voltage range 7 of the sensor is between 0.3 V and 4.8 V, Equation (28) shown below must be satisfied.

$$R5/\{R1//R01//(R3//R03+R02)+R5\}\times Vcc \geq \text{the lower-limit value of the upper dialog-voltage range 6} \quad (27)$$

$$R5/\{R1//R01//(R3//R03+R02)+R5\}\times Vcc>4.8 \quad (28)$$

According to the second embodiment, described above, the second resistance means 22 can be omitted by using the first resistance means 21 via the third resistance means 23 as the pull-down resistance when the power line is broken, and as the pull-up resistance when the ground line is broken. Consequently, during a normal operation, when no wires are broken, the source-current ability of the signal output-circuit output-stage amplifier 31 is not restricted by the second resistance means 22, thereby reducing the scale of the circuit.

Figure 11:
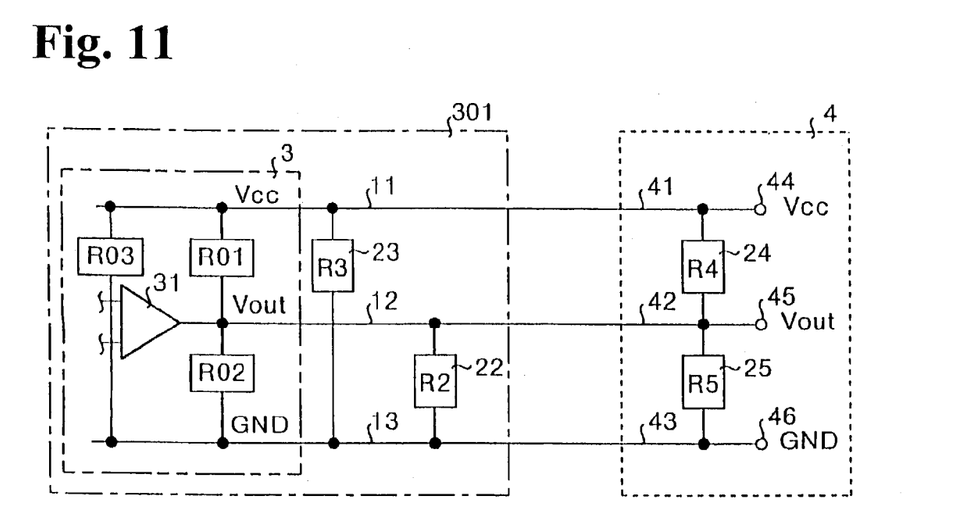
FIG. 11 is a circuit diagram showing a configuration of a broken-wire failure detection circuit according to the third embodiment of the present invention.

FIG. 11 is a circuit diagram showing a configuration of a broken-wire failure detection circuit according to the third embodiment of the present invention. As shown in FIG. 11, the broken-wire failure detection circuit according to the third embodiment corresponds to the conventional broken-wire failure detection circuit shown in FIG. 16, wherein the third resistance means 23 is connected between the functional-circuit-side power line 11 and the functional-circuit-side ground line 13, and the first resistance means 21 (see FIG. 16) is removed. That is, in a functional circuit 301, the second resistance means 22 is connected between the signal line 12 and the ground line 13. Further, the third resistance means 23 is connected between the power line 11 and the ground line 13. Other arrangements of the functional circuit 301 and the configuration of the higher circuit 4 are the same as those shown in FIG. 16. Thus, they are denoted by the same reference numerals as in FIG. 16, and their descriptions are omitted.

Figure 12:
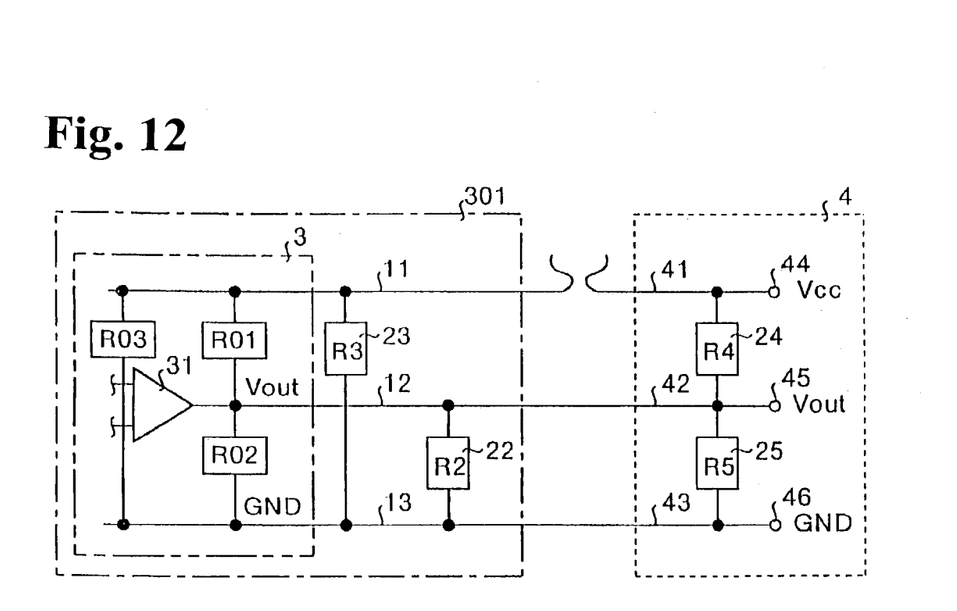
FIG. 12 is a circuit diagram showing a broken power line in the broken-wire failure detection circuit according to the third embodiment of the present invention.

In the configuration shown in FIG. 11, when a connection between the power line 11 of the functional circuit 301 and the power line 41 of the higher circuit 4 is broken as shown in FIG. 12, the second resistance means 22 and the fifth resistance means 25 of the higher circuit 4 are connected in parallel. At this time, the apparent pull-down-resistance value corresponds to the composite resistance value $(R2//R02//R5//(R01+R3//R03))$ obtained by combining the internal resistance values R01, R02, and R03.

Accordingly, Equation (29) shown below defines the output voltage Vout determined from the partial voltage ratio of the pull-down-resistance value $(R2//R02//R5//(R01+R3//R03))$ to the resistance value R4 of the fourth resistance means 24 of the higher circuit 4.

$$V\text{out}=\{R2//R02//R5//(R01+R3//R03)\}/\{R2//R02//R5(R01+R3//R03)+R4\}\times Vcc \quad (29)$$

Figure 13:
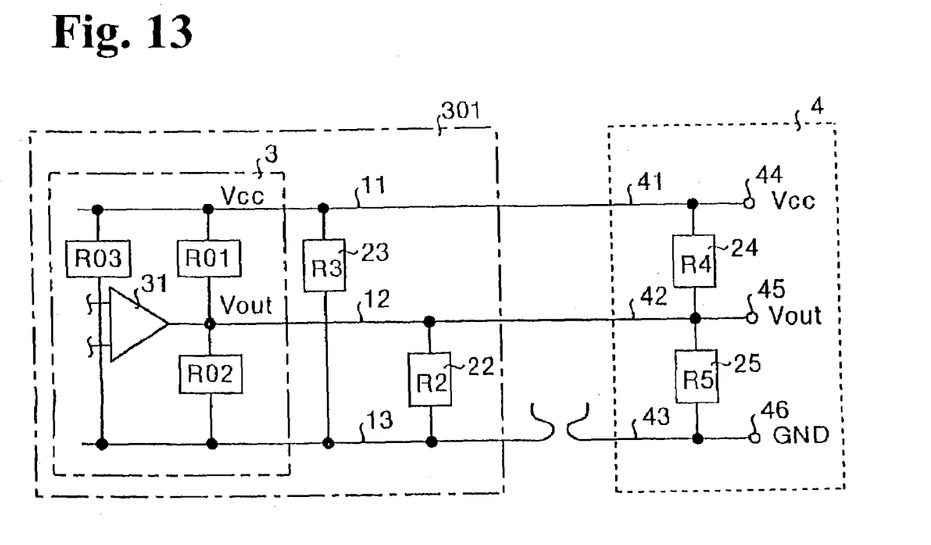
FIG. 13 is a circuit diagram showing a broken ground line in the broken-wire failure detection circuit according to the third embodiment of the present invention.

Further, in the configuration shown in FIG. 11, when a connection between the ground line 13 of the functional circuit 301 and the ground line 43 of the higher circuit 4 is broken as shown in FIG. 13, the fourth resistance means 24 of the higher circuit 4 and the second and third resistance means 22 and 23, all of which constitute a series-connected unit, are connected in parallel. At this time, the apparent pull-up-resistance value corresponds to the composite resistance value $(R4//(R2//R02+R3//R03)//R01)$ obtained by combining the internal resistance values R01, R02, and R03.

Accordingly, Equation (30) shown below defines the output voltage Vout determined from the partial voltage ratio of the apparent pull-up-resistance value $(R4//(R2//R02+R3//R03)//R01)$ to the resistance value R5 of the fifth resistance means 25 of the higher circuit 4.

$$V\text{out}=R5/\{R4//(R2//R02+R3//R03)//R01+R5\}\times Vcc \quad (30)$$

Also in this case, the third resistance means 23 is independent of the load-driving ability (sink current) of the signal output-circuit output-stage amplifier 31. Consequently, the third resistance means does not affect the voltage value of an output signal if no wires are broken. This eliminates the need to increase the load-driving ability (sink current) of the signal output-circuit output-stage amplifier 31, thus suppressing an increase in the scale of the circuit.

In this case, the value of the output voltage Vout defined by Equation (29), described previously, is within the lower dialog-voltage range 5 in FIG. 17. On the other hand, the value of the output voltage Vout defined by Equation (30), described previously, is within the upper dialog-voltage range 6 in FIG. 17. Consequently, in the configuration shown in FIG. 11, the resistance values R2 and R3 of the second and third resistance means 22 and 23, respectively, are selected so as to satisfy Equations (31) and (32).

$$\{R2//R02//R5//(R01+R3//R03)\}/\{R2//R02//R5//(R01+R3//R03)+R4\} \times Vcc \leq \text{the upper-limit value of the lower dialog-voltage range 5} \quad (31)$$

$$R5/\{R4//(R02//R02+R3//R03)//R01+R5\} \times Vcc \geq \text{the lower-limit value of the upper dialog-voltage range 6} \quad (32)$$

For example, when the normal output-voltage range 7 of the sensor is between 0.3 V and 4.8 V, then both Equations (33) and (34) must be satisfied.

$$\{R2//R02//R5//(R01+R3//R03)\}/\{R2//R02//R5//(R01+R3//R03)+R4\} \times Vcc < 0.3 \quad (33)$$

$$R5/\{R4//(R02//R02+R3//R03)//R01+R5\} \times Vcc > 4.8 \quad (34)$$

Figure 14:
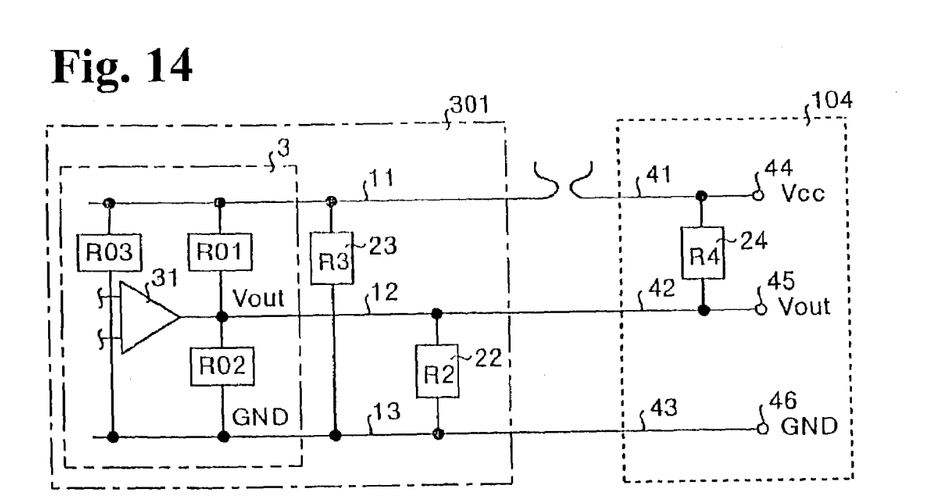
FIG. 14 is a circuit diagram showing another example in which the power line is broken in the broken-wire failure detection circuit according to the third embodiment of the present invention.

As shown in FIG. 14, when the functional circuit 301 is connected to the higher circuit 104 having only the fourth resistance means 24, and the connection between the power line 11 of the functional circuit 301 and the power line 41 of the higher circuit 104 is broken, the second resistance means 22 constitutes the pull-down resistance. The pull-down-resistance value (R2//R02//(R3//R03+R01)) is obtained by combining the internal resistance values R01, R02, and R03.

Accordingly, Equation (35) shown below defines the output voltage Vout determined from the partial voltage ratio of the pull-down-resistance value R2 to the resistance value R4 of the fourth resistance means 24 of the higher circuit 104.

$$Vout=\{R2//R02//(R3//R03+R01)\}/\{R2//R02//(R3//R03+R01)+R4\} \times Vcc \quad (35)$$

In this case, the value of the output voltage Vout defined by Equation (35), described previously, is within the lower dialog-voltage range 5 in FIG. 17. Consequently, in the configuration shown in FIG. 14, the resistance value R2 of the second resistance means 22 is selected so as to meet Equation (36) shown below. For example, when the normal output-voltage range 7 of the sensor is between 0.3 V and 4.8 V, Equation (37) shown below must be satisfied.

$$\{R2//R02//(R3//R03+R01)\}/\{R2//R02//(R3//R03+R01)+R4\} \times Vcc \leq \text{the upper-limit value of the lower dialog-voltage range 5} \quad (36)$$

$$\{R2//R02//(R3//R03+R01)\}/\{R2//R02//(R3//R03+R01)+R4\} \times Vcc < 0.3 \quad (37)$$

Figure 15:
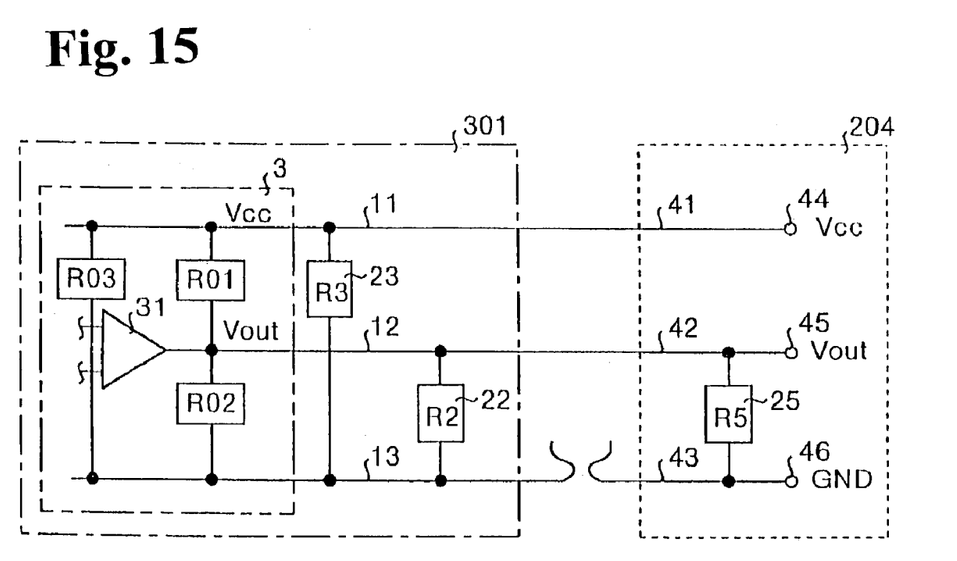
FIG. 15 is a circuit diagram showing another example in which the ground line is broken in the broken-wire failure detection circuit according to the third embodiment of the present invention.

Further, as shown in FIG. 15, when the functional circuit 301 is connected to the higher circuit 204 having only the fifth resistance means 25, and the connection between the ground line 13 of the functional circuit 301 and the ground line 43 of the higher circuit 204 is broken, the second and third resistance means 22 and 23 are connected in series. At this time, the pull-up resistance corresponds to the composite resistance value (R01//(R2//R02+R3//R03)) obtained by combining the internal resistance values R01, R02, and R03. That is, the pull-up-resistance value is (R01//(R2//R02+R3//R03)), obtained by combining the internal resistance values R01, R02, and R03.

Accordingly, Equation (38) shown below defines the output voltage Vout determined from the partial voltage ratio of the pull-up-resistance value (R01//(R2//R02+R3//R03)) to the resistance value R5 of the fifth resistance means 25 of the higher circuit 204.

$$Vout=R5/\{R01//(R2//R02+R3//R03)+R5\} \times Vcc \quad (38)$$

Also in this case, the third resistance means 23 is independent of the load-driving ability (sink current) of the signal output-circuit output-stage amplifier 31. Consequently, the third resistance means does not affect the voltage value of an output signal if no wires are broken. This eliminates the need to increase the load-driving ability (sink current) of the signal output-circuit output-stage amplifier 31, thus suppressing an increase in the scale of the circuit.

In this case, the value of the output voltage Vout defined by Equation (38), described previously, is within the upper dialog-voltage range 6 in FIG. 17. Consequently, in the configuration shown in FIG. 15, the resistance values R2 and R3 of the second and third resistance means 22 and 23 are selected so as to satisfy Equation (39) shown below. For example, when the normal output-voltage range 7 of the sensor is between 0.3 V and 4.8 V, Equation (40) shown below must be satisfied.

$$R5/\{R01//(R2//R02+R3//R03)+R5\} \times Vcc \geq \text{the lower-limit value of the upper dialog-voltage range 6} \quad (39)$$

$$R5/\{R01//(R2//R02+R3//R03)+R5\} \times Vcc > 4.8 \quad (40)$$

According to the third embodiment, described above, the first resistance means 21 can be omitted by using the second resistance means 22 via the third resistance means 23 as the pull-down resistance when the power line is broken, and as the pull-up resistance when the ground line is broken. Consequently, during normal operations, when no wires are broken, the sink current ability of the signal output-circuit output-stage amplifier 31 is not restricted by the first resistance means 21. This enables the scale of the circuit to be reduced.

The present invention is not limited to the above-described embodiments, and many changes may be made. Further, the present invention is not limited to cases in which the functional circuit is a semiconductor pressure sensor. The present invention is applicable to a broken-wire failure detection circuit of an apparatus employing as a functional circuit a sensor for any physical quantity such as temperature, humidity, speed, acceleration, light, magnetism, or sound.

According to the present invention, the third resistance means serves to reduce the apparent pull-down-resistance value when the connection between the functional-circuit-side power line and the power line of the higher circuit is broken. On the other hand, the apparent pull-up-resistance value decreases when the connection between the functional-circuit-side ground line and the ground line of the higher circuit is broken. Further, the third resistance means is independent of the load-driving ability of the signal output circuit in the functional circuit. Consequently, the third resistance means does not affect the voltage value of an output signal if no wires are broken. It is thus unnecessary to increase the load-driving ability of the signal output circuit. Therefore, the upper-limit value of the lower dialog-voltage range can be reduced and the lower-limit value of the upper dialog-voltage range can be increased, while avoiding an increase in the scale of the circuit.

Further, according to the present invention, the second resistance means can be omitted by using the first resistance means as both the pull-up resistance and pull-down resistance. Furthermore, the first resistance means can be omitted by using the second resistance means as both the pull-up resistance and pull-down resistance. Consequently, the scale of the circuit can be reduced with no restrictions on the load-driving ability of the signal output circuit, such as its source or sink current ability.

While the invention has been explained with reference to the specific embodiments of the invention, the explanation is illustrative and the invention is limited only by the appended claims.

What is claimed is:

1. A combination comprising a broken-wire-failure detection circuit and a higher circuit connected thereto, said broken-wire-failure detection circuit including a first power line; a first signal line; a first ground line; at least one of first resistance means connected between the first power line and the first signal line, and second resistance means connected between the first signal line and the first ground line; third resistance means connected between the first power line and the first ground line; an internal resistance value R01 between the first power line and the first signal line; an internal resistance value R02 between the first signal line and the first ground line; and an internal resistance value R03 between the first power line and the first ground line, and said higher circuit including a second power line connected to the first power line; a second signal line connected to the first signal line and having a signal output terminal; a second ground line connected to the first ground line; and at least one of fourth resistance means connected between the second power line and the second signal line, and fifth resistance means connected between the second signal line and the second ground line, wherein said third resistance means serves to reduce an apparent pull-down-resistance value when a connection between the first power line and the second power line is broken, and decrease an apparent pull-up-resistance value when a connection between the first ground line and the second ground line is broken.

2. A combination according to claim 1, wherein said first resistance means, said second resistance means, and said third resistance means have resistance values R1, R2 and R3, respectively; the fourth resistance means has a resistance value R4; and the fifth resistance means has a resistance value R5.

3. A combination according to claim 2, wherein said R1, R2 and R3 are selected so that when the second power line is disconnected from the first power line, a value of $\{R2//R02//R5//(R1//R01+R3//R03)\}/\{R2//R02//R5//(R1//R01+R3//R03)+R4\} \times Vcc$ becomes smaller than an output voltage at the signal output terminal when there is no broken connection, wherein // is a composite resistance of two or more resistances connected in parallel, and Vcc is a power voltage applied to the second power line.

4. A combination according to claim 2, wherein said R1, R2 and R3 are selected so that when the first ground line is disconnected from the second ground line, a value of $R5/\{R1//R01//R4//(R2//R02+R3//R03)+R5\} \times Vcc$ becomes larger than an output voltage at the signal output terminal when there is no broken connection, wherein // is a composite resistance of two or more resistances connected in parallel, and Vcc is a power voltage applied to the second power line.

5. A combination according to claim 2, wherein said higher circuit has the fourth resistance means connected between the second power line and the second signal line without the fifth resistance means, and said R1, R2 and R3 are selected so that when the first power line is disconnected from the second power line, a value of $\{R2//R02//(R1//R01+R3//R03)\}/\{R2//R02//(R1//R01+R3//R03)+R4\} \times Vcc$ becomes smaller than an output voltage at the signal output terminal when there is no broken connection, wherein // is a composite resistance of two or more resistances connected in parallel, and Vcc is a power voltage applied to the second power line.

6. A combination according to claim 2, wherein said higher circuit has the fifth resistance means connected between the second signal line and the second ground line without the fourth resistance, and said R1, R2 and R3 are selected so that when the first ground line is disconnected from the second ground line, a value of $R5/\{R1//R01//(R2//R02+R3//R03)+R5\} \times Vcc$ becomes greater than an output voltage at the signal output terminal when there is no broken connection, wherein // is a composite resistance of two or more resistances connected in parallel, and Vcc is a power voltage applied to the second power line.

7. A combination according to claim 2, wherein said broken-wire-failure detection circuit has the first resistance means and the third resistance means without the second resistance means.

8. A combination according to claim 7, wherein said R1 and R3 are selected so that when the first power line is disconnected from the second power line, a value of $\{R5//R02//(R1//R01+R3//R03)\}/\{R5//R02//(R1//R01+R3//R03)+R4\} \times Vcc$ becomes smaller than an output voltage at the signal output terminal when there is no broken connection, wherein // is a composite resistance of two or more resistances connected in parallel, and Vcc is a power voltage applied to the second power line.

9. A combination according to claim 7, wherein said R1 and R3 are selected so that when the first ground line is disconnected from the second ground line, a value of $R5/\{R1//R01//R4//(R3//R03+R02)+R5\} \times Vcc$ becomes greater than an output voltage at the signal output terminal when there is no broken connection, wherein // is a composite resistance of two or more resistances connected in parallel, and Vcc is a power voltage applied to the second power line.

10. A combination according to claim 2, wherein said higher circuit has the fourth resistance means without the fifth resistance means, said broken-wire-failure detection circuit has the first resistance means and the third resistance means without the second resistance means, and said R1 and R3 are selected so that when the first power line is disconnected from the second power line, a value of $\{(R1//R01+R3//R03)//R02\}/\{(R1//R01+R3//R03)//R02+R4\} \times Vcc$ becomes smaller than an output voltage at the signal output terminal when there is no broken connection, wherein // is a composite resistance of two or more resistances connected in parallel, and Vcc is a power voltage applied to the second power line.

11. A combination according to claim 2, wherein said higher circuit has the fifth resistance means without the fourth resistance means, said broken-wire-failure detection circuit has the first resistance means and the third resistance means without the second resistance means, and said R1 and R3 are selected so that when the first ground line is disconnected from the second ground line, a value of R5/{R1//R01//(R3//R03+R02)+R5}×Vcc becomes greater than an output voltage at the signal output terminal when there is no broken connection, wherein // is a composite resistance of two or more resistances connected in parallel, and Vcc is a power voltage applied to the second power line.

12. A combination according to claim 2, wherein said broken-wire-failure detection circuit has the second resistance means and the third resistance means without the first resistance means.

13. A combination according to claim 12, wherein said R2 and R3 are selected so that when the first power line is disconnected from the second power line, a value of {R2//R02//R5//(R01+R3//R03)}/{R2//R02//R5//(R01+R3//R03)+R4}×Vcc becomes smaller than an output voltage at the signal output terminal when there is no broken connection, wherein // is a composite resistance of two or more resistances connected in parallel, and Vcc is a power voltage applied to the second power line.

14. A combination according to claim 12, wherein said R2 and R3 are selected so that when the first ground line is disconnected from the second ground line, a value of R5/{R4//(R2//R02+R3//R03)//R01+R5}×Vcc becomes larger than an output voltage at the signal output terminal when there is no broken connection, wherein // is a composite resistance of two or more resistances connected in parallel, and Vcc is a power voltage applied to the second power line.

15. A combination according to claim 2, wherein said higher circuit has the fourth resistance means without the fifth resistance means, said broken-wire-failure detection circuit has the second resistance means and the third resistance means without the first resistance means, and said R2 and R3 are selected so that when the first power line is disconnected from the second power line, a value of {R2//R02//(R3//R03+R01)}/{R2//R02//(R3//R03+R01)+R4}×Vcc becomes smaller than an output voltage at the signal output terminal when there is no broken connection, wherein // is a composite resistance of two or more resistances connected in parallel, and Vcc is a power voltage applied to the second power line.

16. A combination according to claim 2, wherein said higher circuit has the fifth resistance means without the fourth resistance means, said broken-wire-failure detection circuit has the second resistance means and the third resistance means without the first resistance means, and said R2 and R3 are selected so that when the first ground line is disconnected from the second ground line, a value of R5/{R01//(R2//R02+R3//R03)+R5}×Vcc becomes greater than an output voltage at the signal output terminal when there is no broken connection, wherein // is a composite resistance of two or more resistances connected in parallel, and Vcc is a power voltage applied to the second power line.

17. A combination according to claim 1, wherein said broken-wire-failure detection circuit includes a signal output circuit having said internal resistance value R01, said internal resistance value R02, and said internal resistance value R03.

18. A combination according to claim 17, wherein said third resistance means is independent of a load-driving ability of the signal output circuit so that the third resistance means does not affect a voltage value of an output signal if no wires are broken.

* * * * *

UNITED STATES PATENT AND TRADEMARK OFFICE
CERTIFICATE OF CORRECTION

| | | |
|---|---|---|
| PATENT NO. | : 7,046,013 B2 | Page 1 of 1 |
| APPLICATION NO. | : 10/401772 | |
| DATED | : May 16, 2006 | |
| INVENTOR(S) | : Katsuyuki Uematsu et al. | |

It is certified that error appears in the above-identified patent and that said Letters Patent is hereby corrected as shown below:

Please change column 1, line 39, "of the higher," to --of the higher--, column 9, line 35, "{(R1//R01+R3//R03)//R02}}/{R1//R01+R3//R03)//" to

--{(R1//R01+R3//R03)//R02}/{R1//R01+R3//R03)//--, column 14, line 43, there is a space between "x Vcc" and "becomes", and column 15, line 23, there is a space between "x Vcc" and "becomes".

Signed and Sealed this

Twenty-second Day of August, 2006

JON W. DUDAS
*Director of the United States Patent and Trademark Office*